United States Patent
Tutt et al.

(10) Patent No.: US 7,052,351 B2
(45) Date of Patent: May 30, 2006

(54) USING HOLE- OR ELECTRON-BLOCKING LAYERS IN COLOR OLEDS

(75) Inventors: Lee W. Tutt, Webster, NY (US); Denis Y. Kondakov, Kendall, NY (US); Myron W. Culver, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 205 days.

(21) Appl. No.: 10/335,444

(22) Filed: Dec. 31, 2002

(65) Prior Publication Data

US 2006/0084347 A1     Apr. 20, 2006

(51) Int. Cl.
*H05B 33/10* (2006.01)

(52) U.S. Cl. ............ 445/24; 445/25; 427/66; 428/690; 313/504; 313/503

(58) Field of Classification Search .......... 313/503, 313/504, 506, 509; 428/690; 427/66; 445/24, 445/25

See application file for complete search history.

(56) References Cited

U.S. PATENT DOCUMENTS

| 5,688,551 | A | | 11/1997 | Littman et al. |
| 5,837,391 | A | * | 11/1998 | Utsugi ................ 428/690 |
| 5,851,709 | A | | 12/1998 | Grande et al. |
| 5,937,272 | A | | 8/1999 | Tang |
| 6,114,088 | A | | 9/2000 | Wolk et al. |
| 6,140,009 | A | | 10/2000 | Wolk et al. |
| 6,194,119 | B1 | * | 2/2001 | Wolk et al. ........... 427/66 |
| 6,214,520 | B1 | | 4/2001 | Wolk et al. |
| 6,221,553 | B1 | | 4/2001 | Wolk et al. |
| 6,468,676 | B1 | * | 10/2002 | Ueda et al. ............ 323/504 |
| 6,586,763 | B1 | * | 7/2003 | Marks et al. ......... 438/22 |
| 2002/0057051 | A1 | * | 5/2002 | Kobayashi .......... 313/504 |

FOREIGN PATENT DOCUMENTS

| EP | 929104 A2 | * | 7/1999 |
| EP | 1215945 | | 9/2002 |
| JP | 11339966 A | * | 12/1999 |
| JP | 2002060843 A | * | 2/2002 |
| WO | WO 00/70655 | | 11/2000 |

* cited by examiner

Primary Examiner—Mariceli Santiago
(74) Attorney, Agent, or Firm—Raymond L. Owens

(57) ABSTRACT

A method for forming a color organic light-emitting device including depositing a first electrode over a substrate; depositing a first emissive layer over the first electrode for producing a first colored light in response to hole-electron recombination; and selectively patternwise depositing a hole-blocking layer over the first emissive layer. The method also includes depositing a second emissive layer over the hole-blocking layer which in response to hole-electron recombination emits colored light different from the colored light emitted from the first emissive layer; depositing a second electrode over the second emissive layer; and whereby the patternwise deposition of the hole-blocking layer has been selected to substantially shift hole-electron recombination from the second to the first emissive layers.

9 Claims, 4 Drawing Sheets

USING HOLE- OR ELECTRON-BLOCKING LAYERS IN COLOR OLEDS

CROSS REFERENCE TO RELATED APPLICATIONS

Reference is made to commonly assigned U.S. patent application Ser. No. 10/055,579 filed Jan. 23, 2002 by David B. Kay et al., entitled "Using a Multichannel Linear Laser Light Beam in Making OLED Devices by Thermal Transfer", the disclosure of which is herein incorporated by reference.

FIELD OF THE INVENTION

The present invention relates to color organic electroluminescent (EL) devices, also known as color organic light-emitting diodes (OLED), and more particularly to an OLED that has at least two emissive layers, which emit different color light.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole-transporting layer (for hole transport) or electron-transporting layer (for electron transport). In forming the RGB pixels in a full-color OLED display panel, it is necessary to devise a method to precisely pattern the emissive layer of the organic EL medium or the entire organic EL medium.

One method for patterning the emissive layer consists of aligning a shadow mask and evaporating through the mask to form the patterned light emission layers. For a multicolor device one alignment, mask and evaporation is needed per color.

A suitable method for patterning high-resolution OLED displays has been disclosed in U.S. Pat. No. 5,851,709 by Grande et al. This method is comprised of the following sequence of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color-forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate.

Littman and Tang (U.S. Pat. No. 5,688,551) teach the patternwise transfer of organic EL material from an unpatterned donor sheet to an EL substrate. A series of patents by Wolk et al. (U.S. Pat. Nos. 6,114,088; 6,140,009; 6,214,520; and 6,221,553) teaches a method that can transfer the luminescent layer of an EL device from a donor element to a substrate by heating selected portions of the donor with a laser beam.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask. The aperture mask can be a separate entity between the donor layer and substrate (as in FIG. 1 in the aforementioned patent), or can be incorporated into the donor layer (as in FIGS. 4, 5, and 6 in the aforementioned patent).

In all these methods one patterned transfer is necessary per color adding to the time and complexity of manufacture. There is a need, therefore, to reduce the number of patterned transfers.

SUMMARY OF THE INVENTION

It is therefore an object of the present invention to reduce the number of patterned transfers and therefore alignments in producing color OLED devices.

This object is achieved by a process for forming a color organic light-emitting device comprising:
 a) depositing a first electrode over a substrate;
 b) depositing a first emissive layer over the first electrode for producing a first colored light in response to hole-electron recombination;
 c) selectively patternwise depositing a hole-blocking layer over the first emissive layer;
 d) depositing a second emissive layer over the hole-blocking layer which in response to hole-electron recombination emits colored light different from the colored light emitted from the first emissive layer;
 e) depositing a second electrode over the second emissive layer; and
 f) whereby the patternwise deposition of the hole-blocking layer has been selected to substantially shift hole-electron recombination from the second to the first emissive layers.

Advantages

It is an advantage of this invention that it reduces handling and makes the manufacturing process of color OLED devices simpler and faster by reducing the number of alignment and patterned transfer steps required. For example, a full-color OLED device can be prepared with just two patterned transfer steps, instead of the three normally required. By selectively patterning a hole- or electron-blocking layer in a color OLED, many of the processing steps can be minimized.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full-color" is employed to describe multicolor display panels that are capable of emitting in the red, green, and blue regions of the visible spectrum and displaying images in any combination of hues. The red, green, and blue colors constitute the three primary color from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel and subpixel. The term "subpixel" is used in multicolor display panels and is employed to designate any portion of a pixel, which can be independently addressable to emit a specific color. For example, a blue subpixel is that portion of a pixel, which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1A:
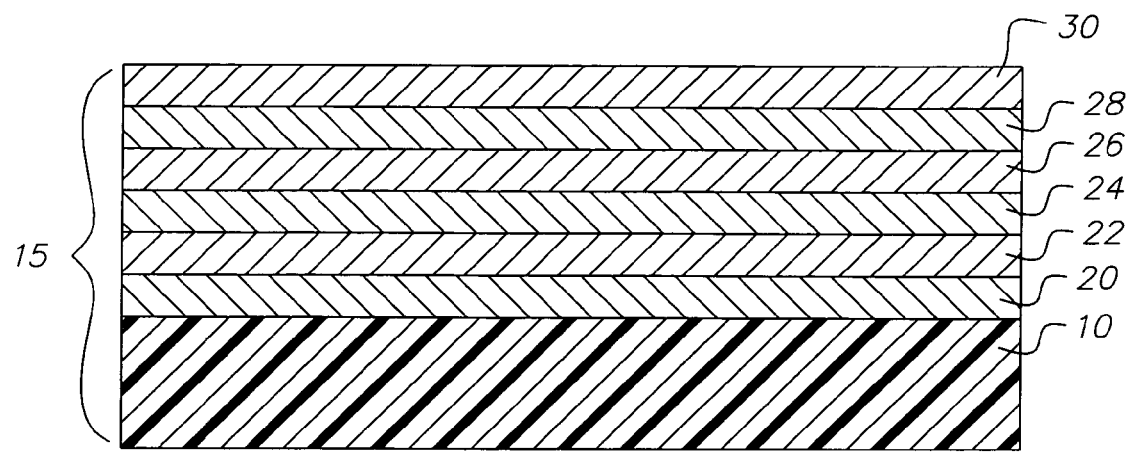
FIG. 1a shows a cross-sectional view of a prior art color OLED device prepared with two light-emitting layers in different colors.

Turning now to FIG. 1a, there is shown a cross-sectional view of a prior art color OLED device prepared with two light-emitting layers in different colors. OLED device 15 includes substrate 10. Substrate 10 can be an organic solid, an inorganic solid, or a combination of organic and inorganic solids that provides a surface for receiving the emissive material from a donor. Substrate 10 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light-absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Substrate 10 can be coated with other layers prior to this step.

A first electrode 20 is deposited over substrate 10. In this embodiment, the first electrode is anode 20. It will be understood that the order of construction of OLED device 15 can be reversed such that the first electrode is a cathode. The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

Although not always required, hole-transporting layer 22 is often deposited over anode 20. Hole-transporting materials useful in hole-transporting layer 22 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A)

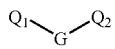

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g. a naphthalene. When G is an aryl group, it is conveniently a phenylene, biphenylene, or naphthalene moiety.

A useful class of triarylamines satisfying structural Formula (A) and containing two triarylamine moieties is represented by structural Formula (B)

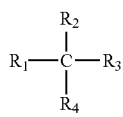

(B)

where $R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula (C)

(C)

wherein $R_5$ and $R_6$ are independently selected aryl groups. In one embodiment, at least one of $R_5$ or $R_6$ contains a polycyclic fused ring structure, e.g. a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D)

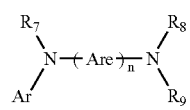

(D)

wherein each Are is an independently selected arylene group, such as a phenylene or anthracene moiety, n is an integer of from 1 to 4, and Ar, $R_7$, $R_8$, and $R_9$ are independently selected aryl groups. In a typical embodiment, at least one of Ar, $R_7$, $R_8$, and $R_9$ is a polycyclic fused ring structure, e.g. a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g. cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

A first emissive layer producing a first colored light in response to hole-electron recombination, e.g. blue emissive layer 24, is deposited over hole-transporting layer 22. A second emissive layer which in response to hole-electron recombination emits colored light different from that emitted from the first emissive layer, e.g. red emissive layer 26, is deposited over blue emissive layer 24. Useful organic emissive materials are well known. As more fully described in U.S. Pat. Nos. 4,769,292 and 5,935,721, the emissive layer of the organic EL element comprises a luminescent or fluorescent material where electroluminescence is produced as a result of electron-hole pair recombination in this region. The emissive layer can be comprised of a single material, but more commonly includes a host material doped with a guest compound or dopant where light emission comes primarily from the dopant and can be of any color. The host materials in the emissive layer can be an electron-transporting material, as defined below, a hole-transporting material, as defined above, or another material that supports hole-electron recombination. The dopant is usually chosen from highly fluorescent dyes, but phosphorescent compounds, e.g. transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g. green, yellow, orange, and red.

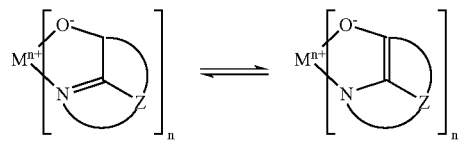

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)];
CO-2: Magnesium bisoxine [alias, bis(8-quinolinolato) magnesium(II)];
CO-3: Bis[benzo{f}-8-quinolinolato]zinc (II);
CO-4: Bis(2-methyl-8-quinolinolato)aluminum(III)-µ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)]; and
CO-7: Lithium oxine [alias, (8-quinolinolato)lithium(I)].

Derivatives of 9,10-di-(2-naphthyl)anthracene (Formula F) constitute one class of useful host materials capable of supporting electroluminescence, and are particularly suitable for light emission of wavelengths longer than 400 nm, e.g. blue, green, yellow, orange or red.

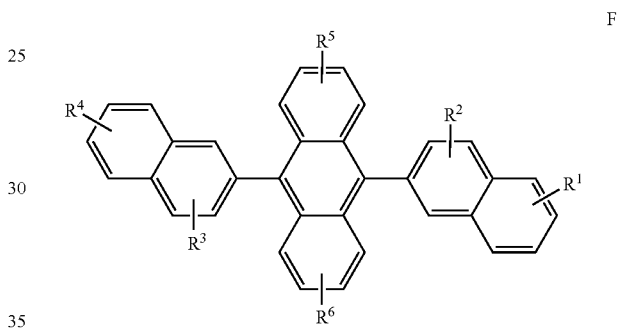

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g. blue, green, yellow, orange or red.

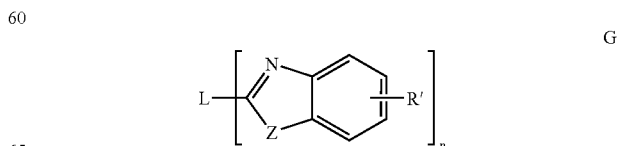

G where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2,2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

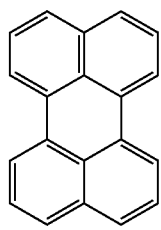

L1

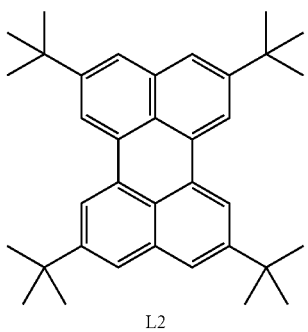

L2

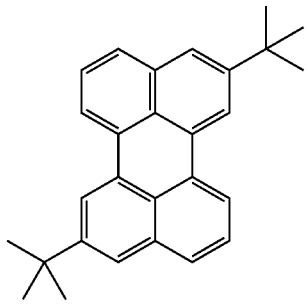

L3

-continued

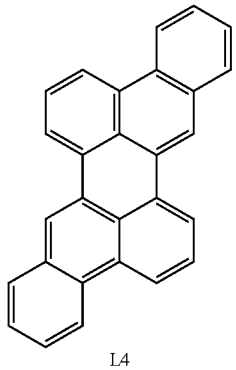

L4

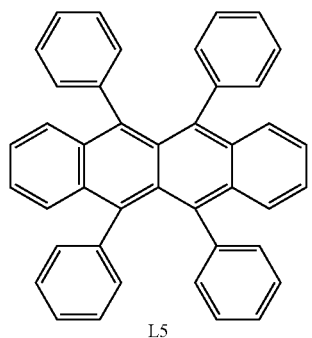

L5

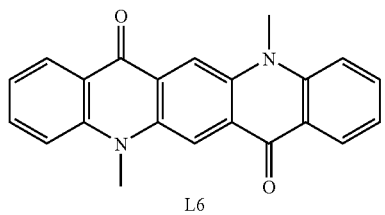

L6

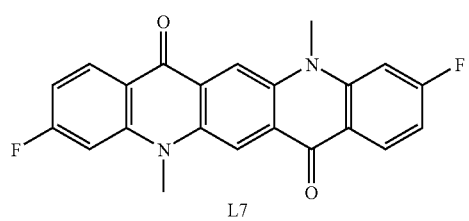

L7

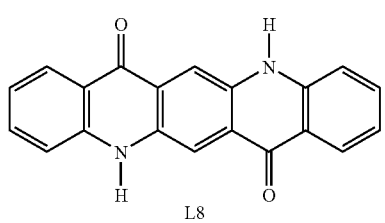

L8

-continued

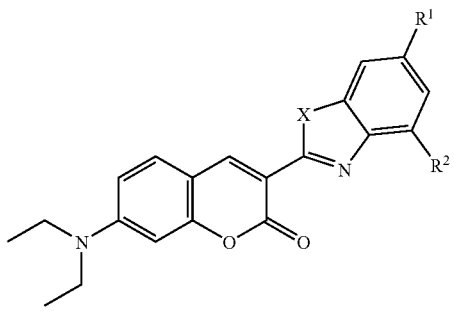

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

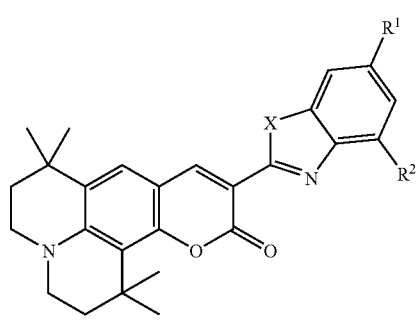

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

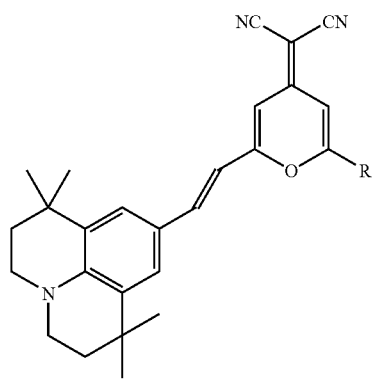

| | R |
|---|---|
| L37 | phenyl |
| L38 | methyl |
| L39 | t-butyl |
| L40 | mesityl |

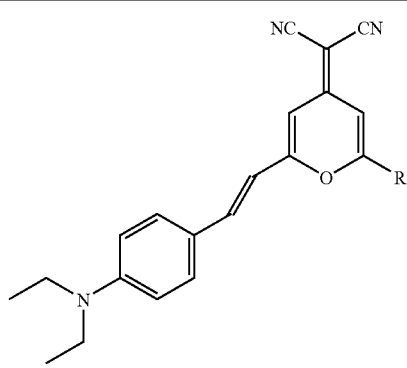

| | R |
|---|---|
| L41 | phenyl |
| L42 | methyl |
| L43 | t-butyl |
| L44 | mesityl |

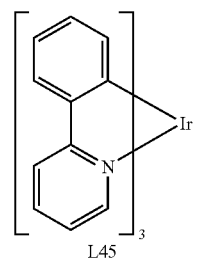

L45

L46

-continued

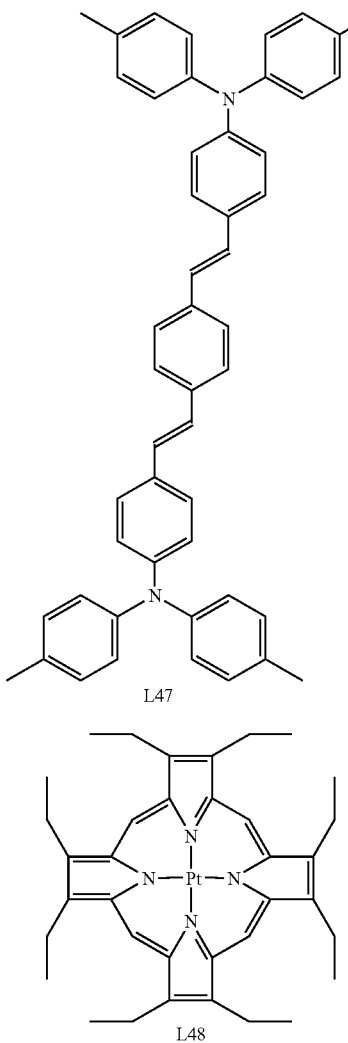

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Although not shown, emissive layers 24 and 26 can additionally each comprise two or more emissive layers, if such is desired for proper emissive properties of the resulting OLED device.

Although not always required, electron-transporting layer 28 is often deposited over red emissive layer 26. Desired electron-transporting materials can be deposited by any suitable means such as evaporation, sputtering, chemical vapor deposition, or electrochemical means. Preferred electron-transporting materials for use in electron-transporting layer 28 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (G) are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

A second electrode 30 is deposited over electron-transporting layer 28. In this embodiment, the second electrode is cathode 30. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED device 15 can also include other layers, such as hole-injecting layers. While not always necessary, it is often useful that a hole-injecting layer be provided over anode 20 in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1. An electron-injecting layer may also be present between the cathode and the electron-transporting layer. Examples of electron-injecting materials include alkali halide salts, such as LiF mentioned above.

When a current is passed through a basic OLED device with a single emissive layer, hole-electron recombination occurs in the emissive layer or at the surface thereof. The emissive layer produces and emits light characteristic of the emissive layer in response to hole-electron recombination. For example, a red emissive layer will produce and emit red light in response to hole-electron recombination. In a device with multiple emissive layers in close proximity (<~20 nm), such as OLED device 15, hole-electron recombination will tend to occur in the emissive layer of the lowest energy, thus generating light of the longer wavelength. In OLED device 15, this is red emissive layer 26 and the light generated is red light.

Figure 1B:
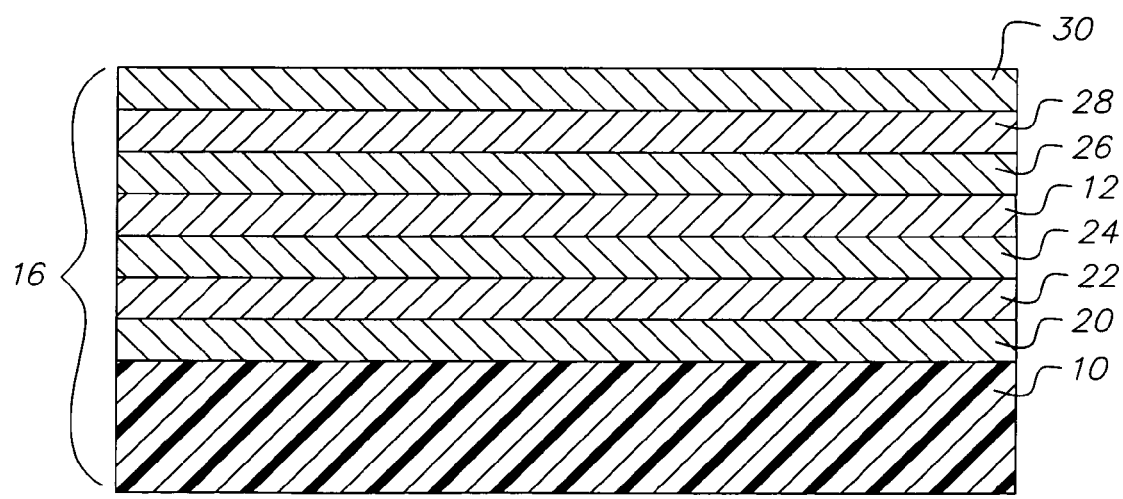
FIG. 1b shows a cross-sectional view of one embodiment of a color OLED device prepared in accordance with this invention with two light-emitting layers in different colors and a hole blocker.

Turning now to FIG. 1b, there is shown a cross-sectional view of one embodiment of an OLED device prepared in accordance with this invention with two light-emitting layers in different colors and a hole-blocking layer. OLED device 16 includes the layers described in OLED device 15, above. Additionally, OLED device 16 includes hole-blocking layer 12 deposited over blue emissive layer 24, and red emissive layer 26 is deposited over hole-blocking layer 12. Hole-blocking layer 12 can be deposited in a patternwise manner using well known photolithographic processes, a shadow mask, or by patterned transfer from a donor material e.g. a laser thermal transfer process, as described by Kay et al. in commonly assigned U.S. patent application Ser. No. 10/055,579 filed Jan. 23, 2002, entitled "Using a Multichannel Linear Laser Light Beam in Making OLED Devices by Thermal Transfer", the disclosure of which is herein incorporated by reference. Hole-blocking layer 12 includes one or more hole-blocking materials. Hole-blocking materials that are most advantageous are those wherein the highest occupied molecular orbital (HOMO) is at a lower energy than the HOMO of the hole-transporting layer, while the lowest unoccupied molecular orbital (LUMO) of the hole-blocking material has an energy level near or below the LUMO of the electron-transporting layer. It will be understood for the purposes of this comparison that the hole-transporting and electron-transporting layers can include emissive layers 24 and 26, which can have electron-transporting and/or hole-transporting properties. Absorption of the hole-blocking material must not have any significant overlap with the emission band. Under these conditions, electrons can flow readily, but holes cannot. Hole-blocking materials that satisfy these requirements can include a chelated oxinoid compound, a phenanthroline compound (e.g. 2,9-dimethyl-4,7-diphenyl-1,10-phenanthroline), a naphthalene compound, a phenanthrene compound, a carbazole compound, a triazole compound (e.g. 3,4,5-triphenyl-1,2,4-triazole; 3-(biphenyl-4-yl)-4-phenyl-5-(4-tert-butylphenyl)-1,2,4-triazole; or 3,5-bis(4-tert-butylphenyl)-4-phenyl-1,2,4-triazole), or an anthracene compound.

When a current is passed through OLED device 16, holes are generated at anode 20. The holes cross hole-transporting layer 22 and enter blue emissive layer 24. The holes are effectively stopped at this point by hole-blocking layer 12. Electrons are generated at cathode 30 and cross electron-transporting layer 28 into red emissive layer 26. Recombination with holes in red emissive layer 26 is not possible as it is in OLED device 15 because holes cannot cross hole-blocking layer 12. Electrons cross hole-blocking layer 12 to undergo hole-electron recombination in blue emissive layer 24, thus generating blue light. Thus, the addition of a hole-blocking layer 12 substantially shifts the hole-electron recombination and the light generated from the energetically more-favored red light to the less-favored blue light. The patternwise deposition of hole-blocking layer 12 can be selected to form a desired multicolor display.

Figure 2A:
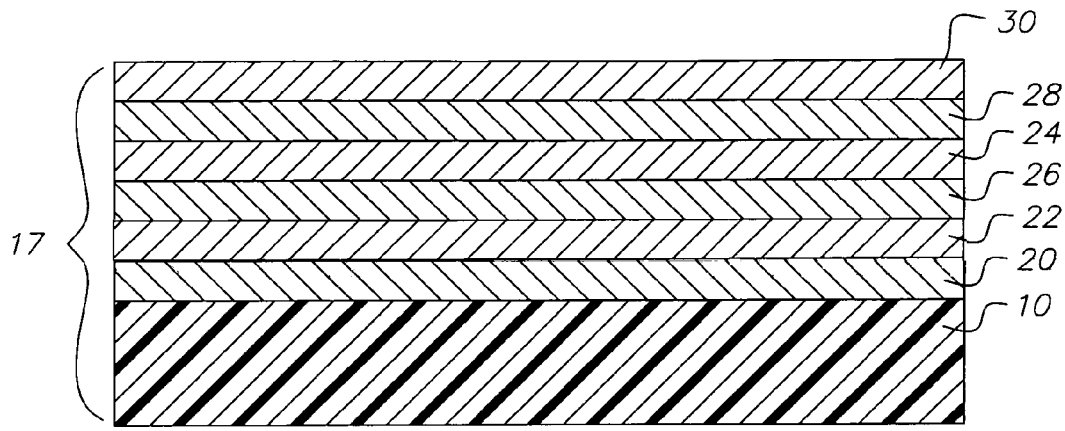
FIG. 2a shows a cross-sectional view of another prior art color OLED device prepared with two light-emitting layers in different colors.

Turning now to FIG. 2a, there is shown a cross-sectional view of a prior art color OLED device prepared with two light-emitting layers in different colors. OLED device 17 includes the same layers as OLED device 15 in FIG. 1a, except the order of blue emissive layer 24 and red emissive layer 26 has been reversed. This does not change the light emitted. When a current is passed through OLED device 17, hole-electron recombination will tend to occur in the emissive layer of the lowest energy among those in close proximity (<~20 nm), thus producing light of the longer wavelength. In OLED device 17, this is red emissive layer 26 and the light produced is red light.

Figure 2B:
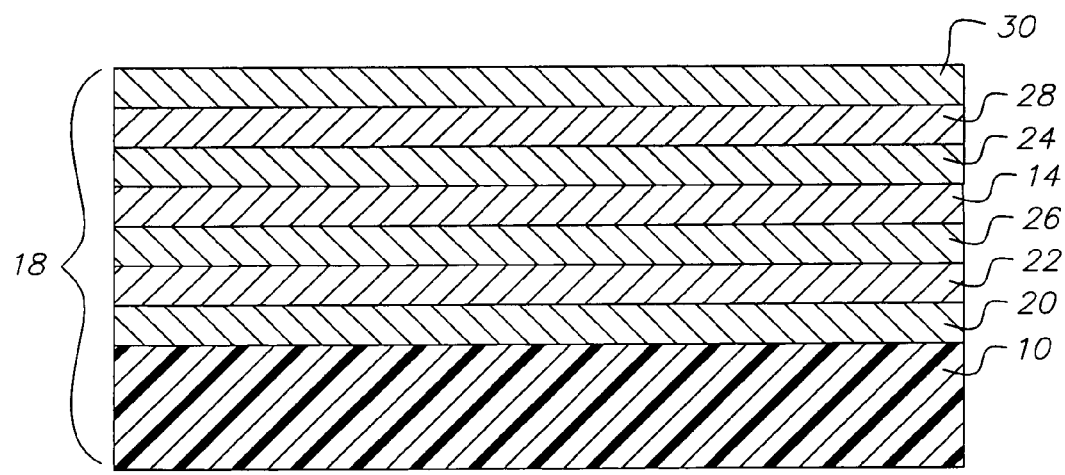
FIG. 2b shows a cross-sectional view of another embodiment of a color OLED device prepared in accordance with this invention with two light-emitting layers in different colors and an electron blocker.

Turning now to FIG. 2b, there is shown a cross-sectional view of another embodiment of an OLED device prepared in accordance with this invention with two light-emitting layers in different colors and an electron-blocking layer. OLED device 18 includes the layers described in OLED device 17, above. Additionally, OLED device 18 includes electron-blocking layer 14 deposited over blue emissive layer 24, and red emissive layer 26 deposited over electron-blocking layer 14. Electron-blocking layer 14 can be deposited in a patternwise manner using well known photolithographic processes, a shadow mask, or by patterned transfer from a donor material by e.g. a laser thermal transfer process, as described by Kay et al. in commonly assigned U.S. patent application Ser. No. 10/055,579 filed Jan. 23, 2002, entitled "Using a Multichannel Linear Laser Light Beam in Making OLED Devices by Thermal Transfer", the disclosure of which is herein incorporated by reference. Electron-blocking layer 14 includes one or more electron-blocking materials. Electron-blocking materials that are most advantageous are those wherein the LUMO is at a higher energy than the LUMO of the electron-transporting layer, while the HOMO of the electron-blocking layer has an energy level near or above the HOMO of the hole-transporting layer. It will be understood for the purposes of this comparison that the hole-transporting and electron-transporting layers can include emissive layers 24 and 26, which can have electron-transporting and/or hole-transporting properties. Absorption of the hole-blocking material must not have any significant overlap with the emission band. Under these conditions, holes can flow readily, but electrons cannot. Electron-blocking materials that satisfy these requirements can include an arylamine compound (e.g. 1,1-bis(4-di-p-tolyl-aminophenyl)cyclohexane), a benzidine compound, or a carbazole compound.

When a current is passed through OLED device 18, electrons are generated at cathode 30. The electrons cross electron-transporting layer 28 and enter blue emissive layer 24. The electrons are effectively stopped at this point by electron-blocking layer 14. Holes are generated at anode 20 and cross hole-transporting layer 22 into red emissive layer 26. Recombination with electrons in red emissive layer 26 is not possible as it is in OLED device 17 because electrons cannot cross electron-blocking layer 14. Holes cross electron-blocking layer 14 to undergo hole-electron recombination in blue emissive layer 24, thus producing blue light. Thus, the addition of an electron-blocking layer 14 substantially shifts the hole-electron recombination and the light produced from the energetically more-favored red light to the less-favored blue light. The patternwise deposition of electron-blocking layer 14 can be selected to form a desired multicolor display.

Figure 3:
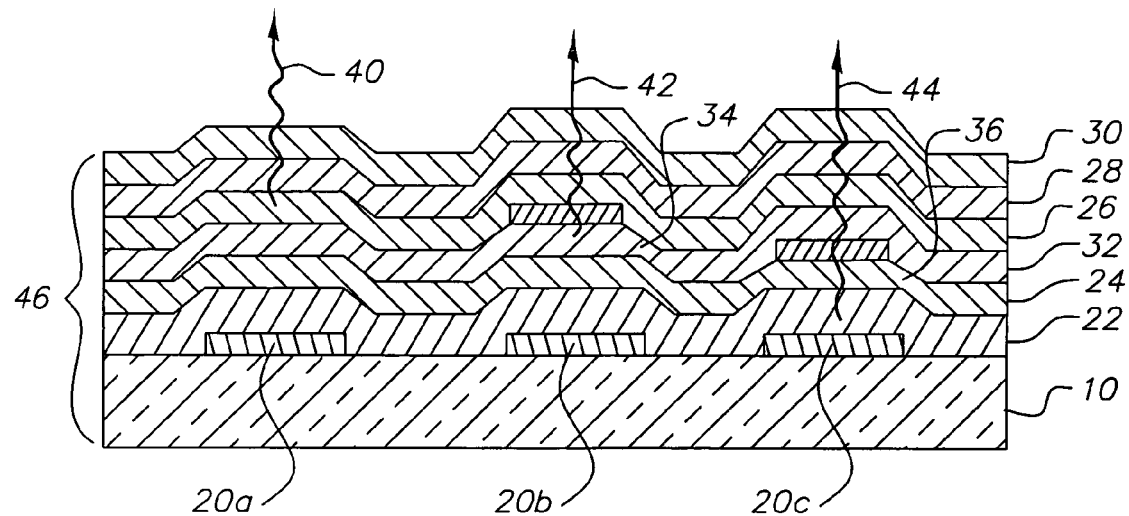
FIG. 3 shows a cross-sectional view of one embodiment of a multicolor OLED device prepared in accordance with this invention.

Turning now to FIG. 3, there is shown a cross-sectional view of one embodiment of a full-color OLED device prepared in accordance with this invention. Full-color OLED device 46 has been prepared with three emissive layers emitting red, green, and blue light. Full-color OLED device 46 includes substrate 10 and anodes 20a, 20b, and 20c. Anodes 20a, 20b, and 20c can be part of a series of linear anodes deposited over substrate 10, which is well known in the art for making passive-matrix displays. Alternatively, anodes 20a, 20b, and 20c can be part of a series of electronic devices, e.g. thin-film transistors (TFT), which are well known in the art for making active matrix displays. Hole-transporting layer 22 is deposited over substrate 10 and anodes 20a, 20b, and 20c. Hole-transporting layer 22 is deposited uniformly using any of a variety of techniques known for forming uniform non-patterned layers, e.g. evaporation, sputtering, chemical vapor deposition, or electrochemical means. A first emissive layer, e.g. blue emissive layer 24, is deposited uniformly over hole-transporting layer 22.

A hole-blocking material is then deposited in a patterned layer. The hole-blocking material is deposited patternwise only in the regions in which it is desired to block movement of holes from blue emissive layer 24 into the green and red emissive layers, that is, in the regions that will be blue pixels in the completed OLED device. In full-color OLED device 46, this is represented by hole-blocking layer 36 deposited over blue emissive layer 24 in the region over anode 20c. A method of depositing material in a patterned manner from a uniform donor has been taught by Littman and Tang in commonly assigned U.S. Pat. No. 5,688,551, the disclosure of which is herein incorporated by reference. Patternwise depositing can be accomplished, e.g. by a laser thermal transfer process, as has been described by Kay et al. in commonly assigned U.S. patent application Ser. No. 10/055,579 filed Jan. 23, 2002, entitled "Using a Multichannel Linear Laser Light Beam in Making OLED Devices by Thermal Transfer", the disclosure of which is herein incorporated by reference. Alternatively, hole-blocking layer 36 can be deposited patternwise by the use of a shadow mask or aperture mask, as has been described by Tang in commonly assigned U.S. Pat. Nos. 5,904,961 and 5,937,272.

A second emissive layer, e.g. green emissive layer 32, is deposited uniformly over blue emissive layer 24 and patterned hole-blocking layer 36. A hole-blocking material is then deposited in a patterned layer. The hole-blocking material is deposited patternwise only in the regions in which it is desired to block movement of holes from green emissive layer 32 into the red emissive layer, that is, in the regions that will be green pixels in the completed OLED device. In full-color OLED device 46, this is represented by hole-blocking layer 34 on green emissive layer 32 in the region over anode 20b.

A third emissive layer, e.g. red emissive layer 26 is deposited uniformly over green emissive layer 32 and patterned hole-blocking layer 34. Electron-transporting layer 28 is deposited uniformly over red emissive layer 26. Cathode 30 is deposited over electron-transporting layer 28. Cathode 30 can be part of a series of linear cathodes patterned in a manner orthogonal to anodes 20a, 20b, and 20c in a passive matrix OLED device. Alternatively, cathode 30 can be uniformly deposited over electron-transporting layer 28 in an active matrix device.

When a current is applied between anode 20a and cathode 30, holes will move away from anode 20a toward cathode 30, and electrons will move from cathode 30 toward anode 20a. As described above, hole-electron recombination will occur in the emissive layer with the lowest potential energy that is readily accessible to both holes and electrons or less than 20 nm away. This is red emissive layer 26, which will produce red light 40. Light is shown as being emitted through cathode 30. It will be understood that the direction of light emission can be through anode 20a, and that the direction of light emission will depend upon the choice of materials in full-color OLED device 46, and in particular the choice of materials in the anodes 20a, 20b, and 20c and cathodes 30.

When a current is applied between anode 20b and cathode 30, holes will move away from anode 20b toward cathode 30, and electrons will move from cathode 30 toward anode 20b. As described above, hole-electron recombination will occur in the emissive layer with the lowest potential energy that is accessible to both holes and electrons. Holes from anode 20b are blocked by hole-blocking layer 34 from moving into red emissive layer 26. Thus, the emissive layer with the lowest potential energy that is readily accessible to both holes and electrons is green emissive layer 32, which will produce green light 42.

When a current is applied between anode 20c and cathode 30, holes will move away from anode 20c toward cathode 30, and electrons will move from cathode 30 toward anode 20c. As described above, hole-electron recombination will occur in the emissive layer with the lowest potential energy that is accessible to both holes and electrons. Holes from anode 20c are blocked by hole-blocking layer 36 from moving into green emissive layer 32. Thus, the only emissive layer that is ready accessible to both holes and electrons is blue emissive layer 24, which will produce blue light 44.

In this way a full-color OLED device, with three colors (red, green, and blue) emitted in a pattern, can be produced with only two patterned depositions, e.g. those of hole-blocking layers 34 and 36.

Figure 4:
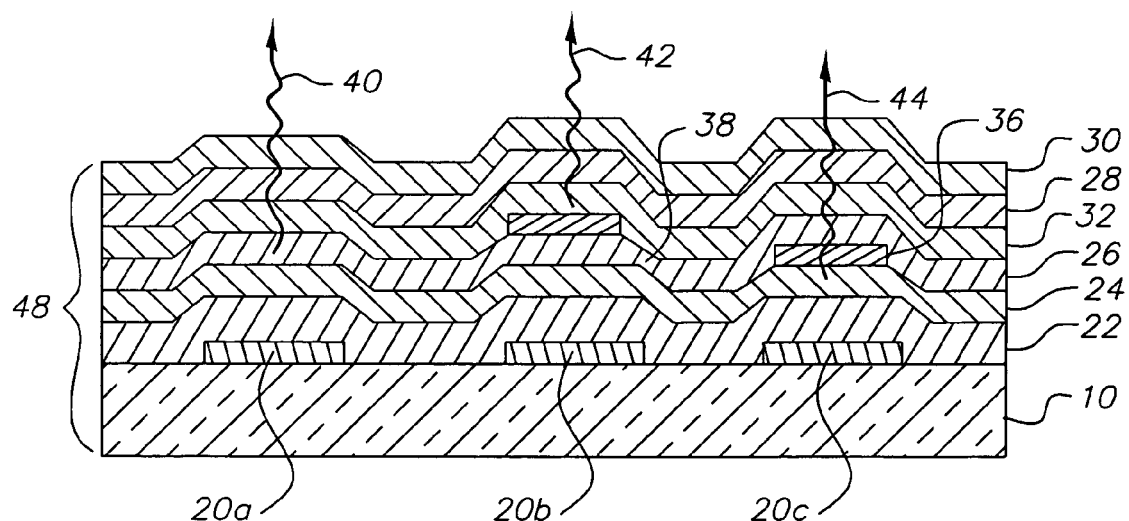
FIG. 4 shows a cross-sectional view of another embodiment of a multicolor OLED device prepared in accordance with this invention.

Turning now to FIG. 4, there is shown a cross-sectional view of another embodiment of a multicolor OLED device prepared in accordance with this invention. Full-color OLED device 48 has been prepared with three emissive layers emitting red, green, and blue light. Full-color OLED device 48 includes substrate 10 and anodes 20a, 20b, and 20c. Anodes 20a, 20b, and 20c can be formed in the manner described for full-color OLED device 46. Hole-transporting layer 22 is deposited uniformly over substrate 10 and anodes 20a, 20b, and 20c. Blue emissive layer 24 is deposited uniformly over hole-transporting layer 22.

A hole-blocking material is then deposited in a patterned layer. The hole-blocking material is deposited patternwise only in the regions in which it is desired to block movement of holes from blue emissive layer 24 into the green and red emissive layers, that is, in the regions that will be blue pixels in the completed OLED device. In full-color OLED device 48, this is represented by hole-blocking layer 36 on blue emissive layer 24 in the region over anode 20c. Patternwise deposition of hole-blocking layer 36 can be accomplished by the various methods described for full-color OLED device 46.

Red emissive layer 26 is deposited uniformly over blue emissive layer 24 and patterned hole-blocking layer 36. An electron-blocking material is then deposited in a patterned layer. The electron-blocking material is deposited patternwise only in the regions in which it is desired to block movement of electrons from the green emissive layer into the red emissive layer, that is, in the regions that will be green pixels in the completed OLED device. In full-color OLED device 48, this is represented by electron-blocking layer 38 on red emissive layer 26 in the region over anode 20b. Patternwise deposition of electron-blocking layer 38 can be accomplished by the various methods described for hole-blocking layers in full-color OLED device 46.

Green emissive layer 32 is deposited uniformly over red emissive layer 26 and patterned electron-blocking layer 38. Electron-transporting layer 28 is deposited uniformly over green emissive layer 32. Cathode 30 is deposited over electron-transporting layer 28 in the manner described for full-color OLED device 46.

When a current is applied between anode 20a and cathode 30, holes will move away from anode 20a toward cathode 30, and electrons will move from cathode 30 toward anode 20a. As described above, hole-electron recombination will occur in the emissive layer with the lowest potential energy that is readily accessible to both holes and electrons. This is red emissive layer 26, which will produce red light 40.

When a current is applied between anode 20b and cathode 30, holes will move away from anode 20b toward cathode 30, and electrons will move from cathode 30 toward anode 20b. As described above, hole-electron recombination will occur in the emissive layer with the lowest potential energy that is accessible to both holes and electrons. Electron-blocking layer 38 blocks electrons from cathode 30 from moving into red emissive layer 26. Thus, the only emissive layer that is readily accessible to both holes and electrons is green emissive layer 32, which will produce green light 42.

When a current is applied between anode 20c and cathode 30, holes will move away from anode 20c toward cathode 30, and electrons will move from cathode 30 toward anode 20c. Hole-blocking layer 36 blocks holes from anode 20c from moving into red emissive layer 26. Thus, the only emissive layer that is readily accessible to both holes and electrons is blue emissive layer 24, which will produce blue light 44.

In this way a full-color OLED device, with three colors (red, green, and blue) emitted in a pattern, can be produced with only two patterned depositions, e.g. those of hole-blocking layer 36 and electron-blocking layer 38.

Figure 5:
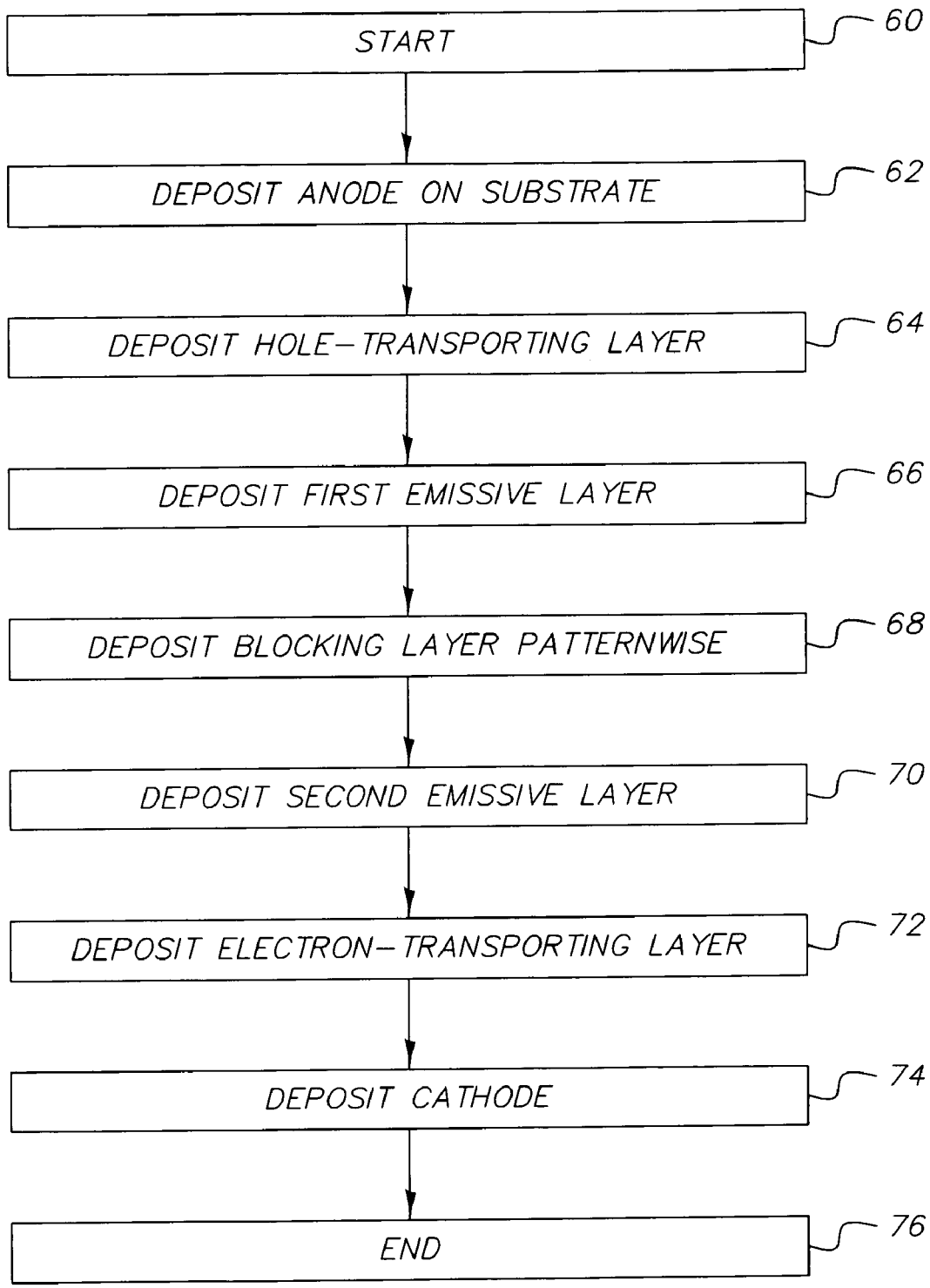
FIG. 5 is a block diagram showing the steps involved in a method according to the present invention.

Turning now to FIG. 5, and referring also to FIG. 1b and FIG. 2b, there is shown a block diagram showing the steps involved in one embodiment of a process for forming a color organic light-emitting device according to the present invention. This method produces a two-color pattern with a single patterned transfer. At the start (Step 60) of the process, anodes or patterns of anodes 20 are deposited over the substrate 10 (Step 62). Alternatively, the anodes 20 can be part of the substrate 10, e.g. an OLED substrate. Then a hole-transporting layer 22 is uniformly deposited on the entire surface such that it will be between anodes 20 and the first emissive layer (Step 64). Then a first emissive layer, that is an emissive layer producing a first colored light in response to hole-electron recombination, is deposited uniformly deposited on the entire surface over the hole-transporting layer 22 (Step 66). The first emissive layer can be, e.g. blue emissive layer 24 in OLED device 16, or red emissive layer 26 in OLED device 18. Then a blocking layer is deposited patternwise over the first emissive layer (Step 68). The blocking layer can be hole-blocking layer 12 as in OLED device 16, or electron-blocking layer 14 as in OLED device 18. Then a second emissive layer, that is an emissive layer which in response to hole-electron recombination emits colored light different from the colored light emitted from the first emissive layer, is deposited uniformly over the blocking layer (Step 70). This can be, e.g. red emissive layer 26 in OLED device 16, or blue emissive layer 24 in OLED device 18. Then an electron-transporting layer 28 is deposited uniformly such that it will be between the second emissive layer and the cathode (Step 72). Then a cathode layer or a series of cathodes 30 is deposited over the electron-transporting layer 28 (Step 74). There can be further steps, for example depositing a protective layer, before the end of the process (Step 76). The patternwise deposition of the blocking layer, either hole-blocking layer 12 or electron-blocking layer 14, is selected to substantially shift hole-electron recombination from red emissive layer 26 to blue emissive layer 24, that is, from the second to the first emissive layers in OLED device 16, and from the first to the second emissive layers in OLED device 18.

The invention and its advantages can be better appreciated by the following comparative examples.

EXAMPLE 1 (INVENTIVE EXAMPLE)

An OLED device with an electron-blocking layer satisfying the requirements of the invention was constructed in the following manner.

1. A clean glass substrate was vacuum-deposited with indium tin oxide (ITO) through a mask to form a pattern of transparent electrodes of 40 to 80 nm thickness.

2. The above-prepared ITO surface was treated with a plasma oxygen etch, followed by plasma deposition of a 0.1 nm layer of a fluorocarbon polymer ($CF_x$) as described in U.S. Pat. No. 6,208,075.

3. The above-prepared substrate was further treated by vacuum-depositing a 40 nm layer of 4,4'-bis[N-(1-naphthyl)-N-phenylamino]biphenyl (NPB) as a hole-transporting layer followed by a 15.3 nm layer of of 2-tert-butyl-9,10-bis(2-naphthyl)anthracene (TBADN) with 2% 4-(dicyanomethylene)-2-t-butyl-6-(1,1,7,7-tetramethyljulolidyl-9-enyl)-4H-pyran (DCJTB) (a red dopant).

4. A coating of 30 nm of 1,1-bis(4-di-p-tolylaminophenyl) cyclohexane (TAPC) as the electron blocker was evaporatively deposited on the above.

5. A 30.125 nm blue emissive layer of TBADN with 1.25% TBP was vacuum-deposited onto the substrate.

6. A 30 nm electron-transporting layer of tris(8-quinolinolato)aluminum (III) (ALQ) was vacuum-deposited onto the substrate at a coating station that included a heated tantalum boat source.

7. A 220 nm cathode layer was deposited onto the receiver element at a coating station with separate tantalum boats, one of which contained silver and one of which contained magnesium. The cathode layer was a 10:1 atomic ratio of magnesium and silver.

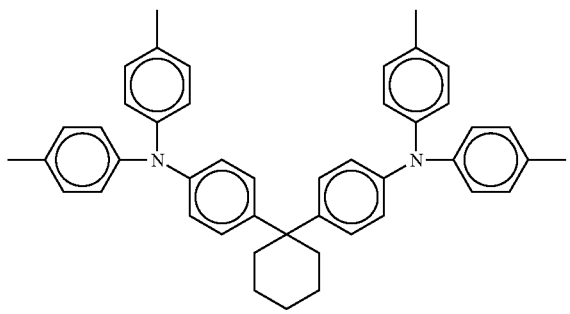

TAPC

EXAMPLE 2 (COMPARATIVE EXAMPLE)

An OLED device was constructed in the manner described in Example 1, except that Step 4 (the deposition of an electron blocker) was skipped.

EXAMPLE 3 (INVENTIVE EXAMPLE)

An OLED device with an electron-blocking layer satisfying the requirements of the invention was constructed in the manner described in Example 1, except Step 3 was performed as follows:

3. The above-prepared substrate was further treated by vacuum-depositing a 40 nm layer of 4,4'-bis[N-(1-naphthyl)-N-phenylamino]biphenyl (NPB) as a hole-transport layer followed by a 20.4 nm layer of of ALQ with 2% 4-(dicyanomethylene)-2-t-butyl-6-(1,1,7,7-tetramethyljulolidyl-9-enyl)-4H-pyran (DCJTB) (a red dopant).

EXAMPLE 4 (COMPARATIVE EXAMPLE)

An OLED device was constructed in the manner described in Example 3, except that Step 4 (the deposition of an electron blocker) was skipped.

EXAMPLE 5 (INVENTIVE EXAMPLE)

An OLED device with an electron blocker deposited by laser thermal transfer and satisfying the requirements of the invention was constructed in the following manner.

1. Onto a polyimide donor support element film having a thickness of 104 microns, a coating of 60 nm of chromium metal was evaporatively deposited.

2. A further coating of 30 nm of TAPC was evaporatively deposited on the above donor support element.

3. A clean glass substrate was vacuum-deposited with indium tin oxide (ITO) through a mask to form a pattern of transparent electrodes of 40 to 80 nm thickness.

4. The above-prepared ITO surface was treated with a plasma oxygen etch, followed by plasma deposition of a 0.1 nm layer of a fluorocarbon polymer ($CF_x$) as described in U.S. Pat. No. 6,208,075.

5. The above-prepared substrate was further treated by vacuum-depositing a 40 nm layer of 4,4'-bis[N-(1-naphthyl)-N-phenylamino]biphenyl (NPB) as a hole-transporting layer followed by a 30.6 nm layer of 2-tert-butyl-9,10-bis(2-naphthyl)anthracene(TBADN)/ALQ in a 3:1 ratio with 2% 4-(dicyanomethylene)-2-t-butyl-6-(1,1,7,7-tetramethyl-julolidyl-9-enyl)-4H-pyran (DCJTB) (a red dopant).

6. The coated side of the donor element prepared in Step 2 was placed in contact with the treated side of the substrate prepared in Step 5 and held in proximal contact using vacuum. A small gap was maintained by a 75 micron spacer.

7. Transfer of the electron blocker layer from the donor element to the substrate was effected by irradiation of the donor element with an infrared laser beam. The beam size was approximately 16 microns by 80 microns to the $1/e^2$ intensity point. The scanning was parallel to the wide beam direction. The dwell time was 27 microseconds with a power density of ~0.53 $J/cm^2$. Transfer was effected by selectively irradiating only the regions desired to emit blue.

8. A 25.3 nm blue emissive layer of TBADN with 1.25% TBP was vacuum-deposited onto the substrate.

9. A 30 nm electron-transport layer of tris(8-quinolinolato) aluminum (III) (ALQ) was vacuum-deposited onto the substrate at a coating station that included a heated tantalum boat source.

10. A 220 nm cathode layer was deposited onto the receiver element at a coating station with separate tantalum boats, one of which contained silver and one of which contained magnesium. The cathode layer was a 10:1 atomic ratio of magnesium and silver.

EXAMPLE 6 (COMPARATIVE EXAMPLE)

An OLED device was constructed in the manner described in Example 5, except that Steps 1, 2, 6, and 7 (the preparation and deposition of an electron blocker) were skipped.

EXAMPLE 7 (INVENTIVE EXAMPLE)

An OLED device with a hole-blocking layer satisfying the requirements of the invention was constructed in the following manner.

1. A clean glass substrate was vacuum-deposited with indium tin oxide (ITO) through a mask to form a pattern of transparent electrodes of 40 to 80 nm thickness.

2. The above-prepared ITO surface was treated with a plasma oxygen etch, followed by plasma deposition of a 0.1 nm layer of a fluorocarbon polymer ($CF_x$) as described in U.S. Pat. No. 6,208,075.

3. The above-prepared substrate was further treated by vacuum-depositing a 40 nm layer of 4,4'-bis[N-(1-naphthyl)-N-phenylamino]biphenyl (NPB) as a hole-transporting layer followed by a 20 nm layer of 9,10-bis(2-naphthyl)anthracene (ADN) with 25% TAPC as the blue emissive layer.

4. A coating of 30 nm of 2,9-dimethyl-4,7-diphenyl-1,10-phenanthroline (BCP) as the hole blocker was evaporatively deposited on the above.

5. A 20.3 nm electron-transporting layer of tris(8-quinolinolato)aluminum (III) (ALQ) with 2% DCJTB was vacuum-deposited onto the substrate as the red emissive layer.

6. A 30 nm electron-transporting layer of tris(8-quinolinolato)aluminum (III) (ALQ) was vacuum-deposited onto the substrate at a coating station that included a heated tantalum boat source.

7. A 220 nm cathode layer was deposited onto the receiver element at a coating station with separate tantalum boats, one of which contained silver and one of which contained magnesium. The cathode layer was a 10:1 atomic ratio of magnesium and silver.

EXAMPLE 8 (COMPARATIVE EXAMPLE)

An OLED device was constructed in the manner described in Example 7, except that Step 4 (the deposition of a hole blocker) was skipped.

Results

The devices were tested by applying a current across the electrodes of 20 $ma/cm^2$ and measuring the intensity and color. The following table shows the results.

| Example | Example type | Blocker | Luminance @ 20 ma (Cd/m$^2$) | Color | CIE X | CIE Y |
|---|---|---|---|---|---|---|
| 1 | Inventive | TAPC (electron) | 486 | blue | 0.16 | 0.20 |
| 2 | Comparative | none | 610 | red | 0.50 | 0.41 |
| 3 | Inventive | TAPC (electron) | 567 | blue | 0.16 | 0.18 |
| 4 | Comparative | none | 356 | red | 0.62 | 0.36 |
| 5 | Inventive | TAPC (electron) | 583 | blue | 0.17 | 0.22 |
| 6 | Comparative | none | 805 | red | 0.59 | 0.37 |
| 7 | Inventive | BCP (hole) | 197 | blue | 0.24 | 0.31 |
| 8 | Comparative | none | 292 | red | 0.61 | 0.36 |

It is evident that the addition of a blocking element can shift the recombination zone to another region and can switch the emitted color from red to blue as desired. The order of emission layer deposition was reversed in the hole blocker examples (i.e. #7 compared to #8) relative to the electron blocker examples. This indicates that the emission layer in which hole-electron recombination occurs shifts toward the anode with a hole blocker, but toward the cathode with an electron blocker.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 12 | hole-blocking layer |
| 14 | electron-blocking layer |
| 15 | OLED device |
| 16 | OLED device |
| 17 | OLED device |
| 18 | OLED device |
| 20 | anode |
| 20a | anode |
| 20b | anode |
| 20c | anode |
| 22 | hole-transporting layer |
| 24 | blue emissive layer |
| 26 | red emissive layer |
| 28 | electron-transporting layer |
| 30 | cathode |
| 32 | green emissive layer |
| 34 | hole-blocking layer |
| 36 | hole-blocking layer |
| 38 | electron-blocking layer |
| 40 | red light |
| 42 | green light |
| 44 | blue light |
| 46 | full-color OLED device |
| 48 | full-color OLED device |
| 60 | block |
| 62 | block |
| 64 | block |
| 66 | block |
| 68 | block |
| 70 | block |
| 72 | block |
| 74 | block |
| 76 | block |

What is claimed is:

1. A method for forming an organic light-emitting device comprising:
    a) depositing a first electrode over a substrate;
    b) depositing a first emissive layer over the first electrode for producing a first colored light in response to hole-electron recombination;
    c) selectively patternwise depositing a first electron-blocking layer over the first emissive layer;
    d.1) depositing a second emissive layer over the first electron-blocking layer which in response to hole-electron recombination emits a second colored light different from the first colored light emitted from the first emissive layer;
    d.2) selectively patternwise depositing a second electron-blocking layer over the second emissive layer;
    d.3) depositing a third emissive layer over the second electron-blocking layer which in response to a hole-electron recombination emits a third color of light different from the first and second colored lights of first and second emissive layers;
    e) depositing a second electrode over the third emissive layer; and
    f) whereby the patternwise deposition of the electron-blocking layers has been selected to substantially shift hole-electron recombination from the first to the second emissive layers and from the second to the third emissive layer.

2. The method of claim 1 wherein either the first, second, or both the first and the second electrode(s) is patterned during deposition.

3. The method of claim 1 further including the step of depositing a hole-transporting layer between the first electrode and the first emissive layer.

4. The method of claim 1 further including the step of depositing an electron-transporting layer between the third emissive layer and the second electrode.

5. The method of claim 4 wherein the highest occupied molecular orbital and lowest unoccupied molecular orbital levels of each electron-blocking layer are such that the lowest unoccupied molecular orbital is at a higher energy than the lowest unoccupied molecular orbital of the electron-transporting layer while the highest occupied molecular orbital has an energy level near or above the highest occupied molecular orbital of the hole-transporting layer.

6. The method of claim 5 wherein the electron-blocking layer consists of an arylamine compound, a benzidine compound, or a carbazole compound.

7. The method of claim 1 wherein one or more of the electron-blocking layers are deposited patternwise by a laser thermal transfer process.

8. The method of claim 1 wherein one or more of the electron-blocking layers are deposited patternwise through a shadow mask.

9. The method of claim 1 wherein the two electron-blocking layers comprise the same material.

* * * * *